US012621951B2

(12) United States Patent
Wang et al.

(10) Patent No.: US 12,621,951 B2
(45) Date of Patent: May 5, 2026

(54) SERVER DEVICE

(71) Applicants: SQ TECHNOLOGY(SHANGHAI) CORPORATION, Shanghai (CN); INVENTEC CORPORATION, Taipei City (TW)

(72) Inventors: Wei Wang, Shanghai City (CN); Zhao Geng, Shanghai City (CN); Guang-Zhao Tian, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 94 days.

(21) Appl. No.: 18/747,030

(22) Filed: Jun. 18, 2024

(65) Prior Publication Data

US 2025/0380375 A1 Dec. 11, 2025

(30) Foreign Application Priority Data

Jun. 5, 2024 (CN) ........................ 202410727989.X

(51) Int. Cl.
*H05K 7/14* (2006.01)
(52) U.S. Cl.
CPC ......... *H05K 7/1489* (2013.01); *H05K 7/1492* (2013.01)
(58) Field of Classification Search
CPC .. H05K 7/1422; H05K 7/1424; H05K 7/1429; H05K 7/1487; H05K 7/1488

USPC ................................................ 361/724–728
See application file for complete search history.

(56) References Cited

U.S. PATENT DOCUMENTS

| | | | | |
|---|---|---|---|---|
| 5,963,431 | A * | 10/1999 | Stancil ................... | G06F 1/186 |
| | | | | 361/796 |
| 7,894,208 | B1 * | 2/2011 | Lin ......................... | G06F 1/187 |
| | | | | 361/730 |
| 8,228,669 | B2 * | 7/2012 | Hu .......................... | G06F 1/183 |
| | | | | 211/41.12 |
| 8,947,876 | B2 * | 2/2015 | Zhu ....................... | H05K 7/1487 |
| | | | | 361/679.58 |
| 9,070,419 | B1 * | 6/2015 | Zhu ........................ | G11B 33/128 |
| 9,265,173 | B1 * | 2/2016 | Jhang ..................... | G06F 1/187 |
| 9,699,931 | B1 * | 7/2017 | Chen ...................... | H05K 7/1489 |
| 10,212,840 | B2 * | 2/2019 | Kuan ..................... | H05K 7/1487 |
| 10,314,195 | B1 * | 6/2019 | Xu ......................... | H05K 7/1417 |

(Continued)

FOREIGN PATENT DOCUMENTS

| | | | |
|---|---|---|---|
| CN | 219225406 U | * | 6/2023 |
| CN | 220041052 U | * | 11/2023 |

*Primary Examiner* — Adrian S Wilson
(74) *Attorney, Agent, or Firm* — Maschoff Brennan

(57) ABSTRACT

A server device is configured for a backplane and a motherboard to be disposed thereon, and includes a chassis, a movable tray and a riser module. The chassis includes a bottom plate and two side plates. The two side plates are connected to two opposite sides of the bottom plate, respectively. The bottom plate is configured for the motherboard to be disposed thereon. The movable tray is movably disposed on the two side plates. The riser module is disposed on the movable tray. The riser module and the movable tray are movable relative to the chassis. The riser module is configured to be electrically connected to the backplane and the motherboard.

8 Claims, 9 Drawing Sheets

(56)                    References Cited

U.S. PATENT DOCUMENTS

| | | | |
|---|---|---|---|
| 10,372,176 B2 * | 8/2019 | Chu | G06F 1/20 |
| 10,383,249 B1 * | 8/2019 | Peng | H05K 7/1489 |
| 11,388,830 B2 * | 7/2022 | Pham | G06F 1/181 |
| 11,763,854 B2 * | 9/2023 | Geng | G11B 33/142 |
| | | | 361/679.39 |
| 11,934,235 B1 * | 3/2024 | Chen | G06F 1/185 |
| 2003/0161114 A1 * | 8/2003 | Berry | H05K 7/1489 |
| | | | 361/740 |
| 2015/0366095 A1 * | 12/2015 | Junkins | G06F 1/18 |
| | | | 312/319.2 |
| 2016/0021778 A1 * | 1/2016 | Chen | H05K 7/1487 |
| | | | 361/679.39 |
| 2017/0265323 A1 * | 9/2017 | Blume | H05K 7/1487 |
| 2019/0204883 A1 * | 7/2019 | Chu | G06F 1/20 |
| 2021/0227715 A1 * | 7/2021 | Mao | H05K 7/1492 |

* cited by examiner

SERVER DEVICE

CROSS-REFERENCE TO RELATED APPLICATIONS

This non-provisional application claims priority under 35 U.S.C. § 119(a) on Patent Application No(s). 202410727989.X filed in China, on Jun. 5, 2024, the entire contents of which are hereby incorporated by reference.

BACKGROUND OF THE INVENTION

Technical Field of the Invention

The invention relates to a server device, more particularly to a server device including a movable tray and a riser module.

Description of the Related Art

In a server, expansion cards provide several functions, such as image processing, network interface, peripheral device interface and data storage. Users may install one or more expansion cards in the server according to their own needs so as to expand the function of the server.

Generally, users may plug expansion cards into a riser board to form an expansion module. Then, the users may install the expansion module in the server. In addition, manufacturers may design the server with a double-layer structure to improve space utilization within the server, and the expansion module and a motherboard are disposed on an upper layer and a lower layer of the server, respectively. However, in the current server with the double-layer structure, when electronic components of the motherboard disposed on the lower layer need to be replaced, the users need to remove the expansion module from the upper layer first. After the electronic components of the motherboard disposed on the lower layer are replaced, the users reinstall the expansion module on the upper layer. Accordingly, steps for replacing the electronic components are too complicated, thereby causing the inconvenience of performing the steps for the users. Therefore, improving the convenience of assembling and disassembling the motherboard and the expansion module and a cable management is one of the problems required to be addressed.

SUMMARY OF THE INVENTION

The invention provides a server device so as to improve the convenience of assembling and disassembling the motherboard and the expansion module and a cable management.

One embodiment of the invention provides a server device configured for a backplane and a motherboard to be disposed thereon. The server device includes a chassis, a movable tray and a riser module. The chassis includes a bottom plate and two side plates. The two side plates are connected to two opposite sides of the bottom plate, respectively. The bottom plate is configured for the motherboard to be disposed thereon. The movable tray is movably disposed on the two side plates. The riser module is disposed on the movable tray. The riser module and the movable tray are movable relative to the chassis. The riser module is configured to be electrically connected to the backplane and the motherboard.

According to the server device disclosed by the above embodiment, the server device includes the movable tray rotatable relative to the chassis, with the riser module disposed on the movable tray. Therefore, when the motherboard disposed on the plate located on the lower layer is required to be mounted or replaced and is required for the cables to be plugged into, the movable tray only needs to be rotated without the need to remove the motherboard and the riser module from the upper layer, allowing the motherboard disposed on the plate located on the lower layer to be easily accessed. Accordingly, the convenience of assembling and disassembling the motherboard and the riser module and the cable management can be improved.

BRIEF DESCRIPTION OF THE DRAWINGS

The invention will become more fully understood from the detailed description given herein below and the accompanying drawings which are given by way of illustration only and thus are not limitative of the invention and wherein.

DETAILED DESCRIPTION

Figure 1:
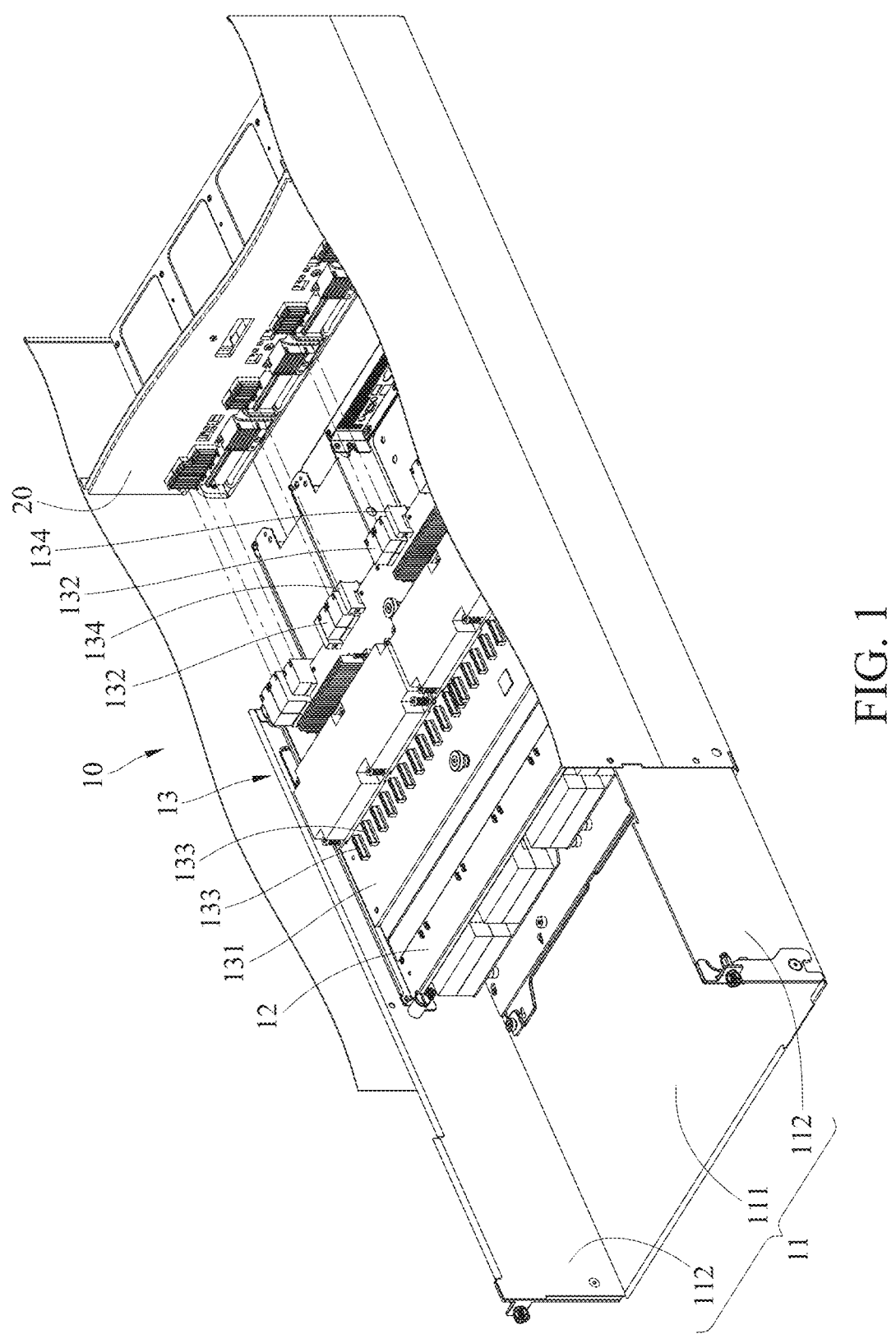
FIG. 1 is a perspective view of a server device in accordance with one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the invention, such as technical and scientific terms, have its own meanings and can be comprehended by those skilled in the art, unless the terms are additionally defined in the invention. That is, the terms used in the following paragraphs should be read on the meaning commonly used in the related fields and will not be overly explained, unless the terms have a specific meaning in the invention.

Figure 2:
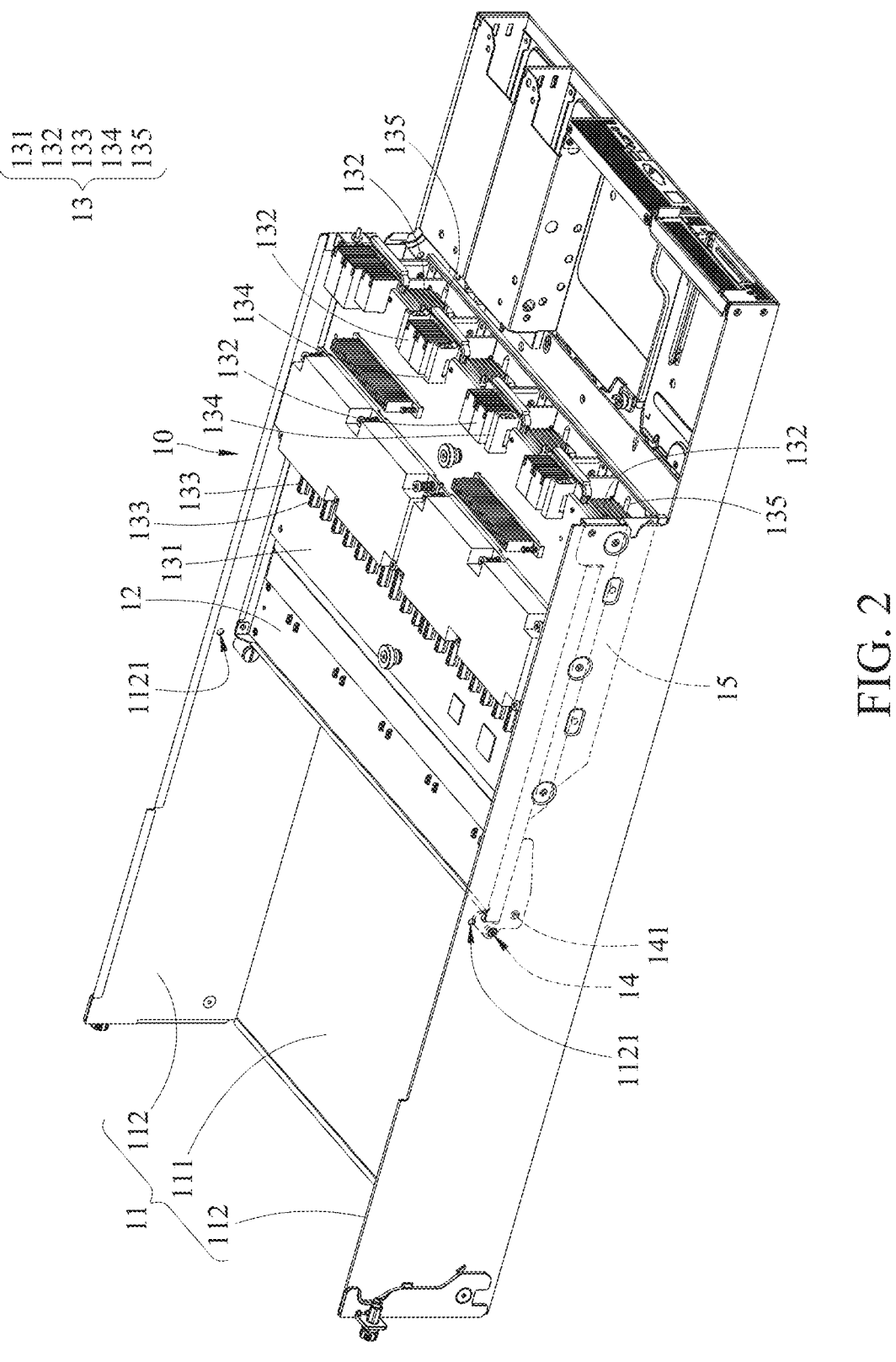
FIG. 2 is another perspective view of the server device in FIG. 1.

Please refer to FIG. 1 and FIG. 2, where FIG. 1 is a perspective view of a server device 10 in accordance with one embodiment of the invention, and FIG. 2 is another perspective view of the server device 10 in FIG. 1.

In this embodiment, the server device 10 is configured for a backplane 20 with expansion cards (not shown) and a motherboard 30 to be disposed thereon. The backplane 20 is, for example, configured to be compatible with various types of expansion cards. The server device 10 includes a chassis 11, a movable tray 12, a riser module 13, two pivot members 14 and a flow guide support frame 15. The chassis 11 includes a bottom plate 111 and two side plates 112. The two side plates 112 are connected to two opposite sides of the bottom plate 111, respectively. The bottom plate 111 is configured for the motherboard 30 to be disposed thereon.

Figure 3:
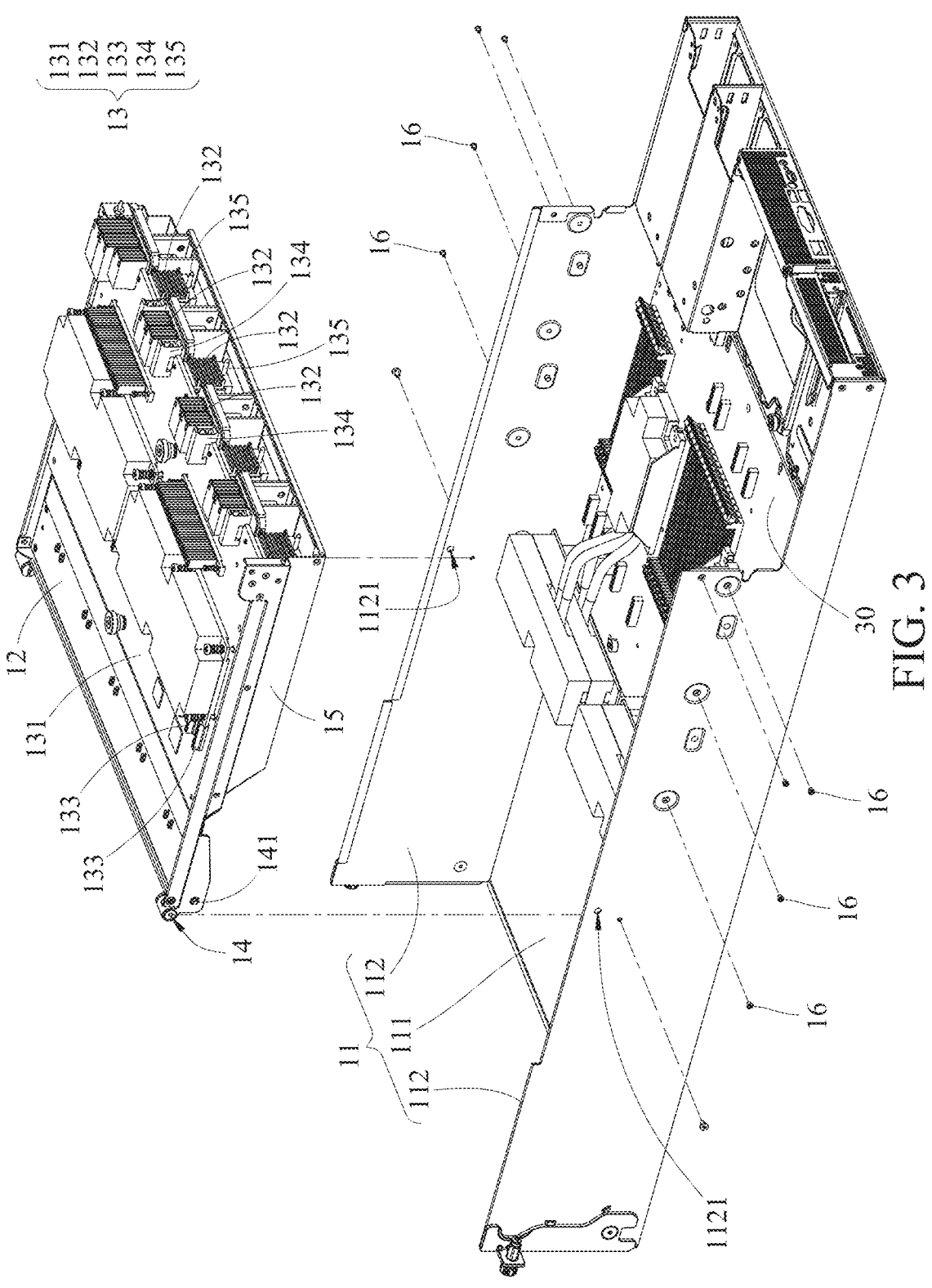
FIG. 3 is an exploded view of the server device in FIG. 1.
Figure 4:
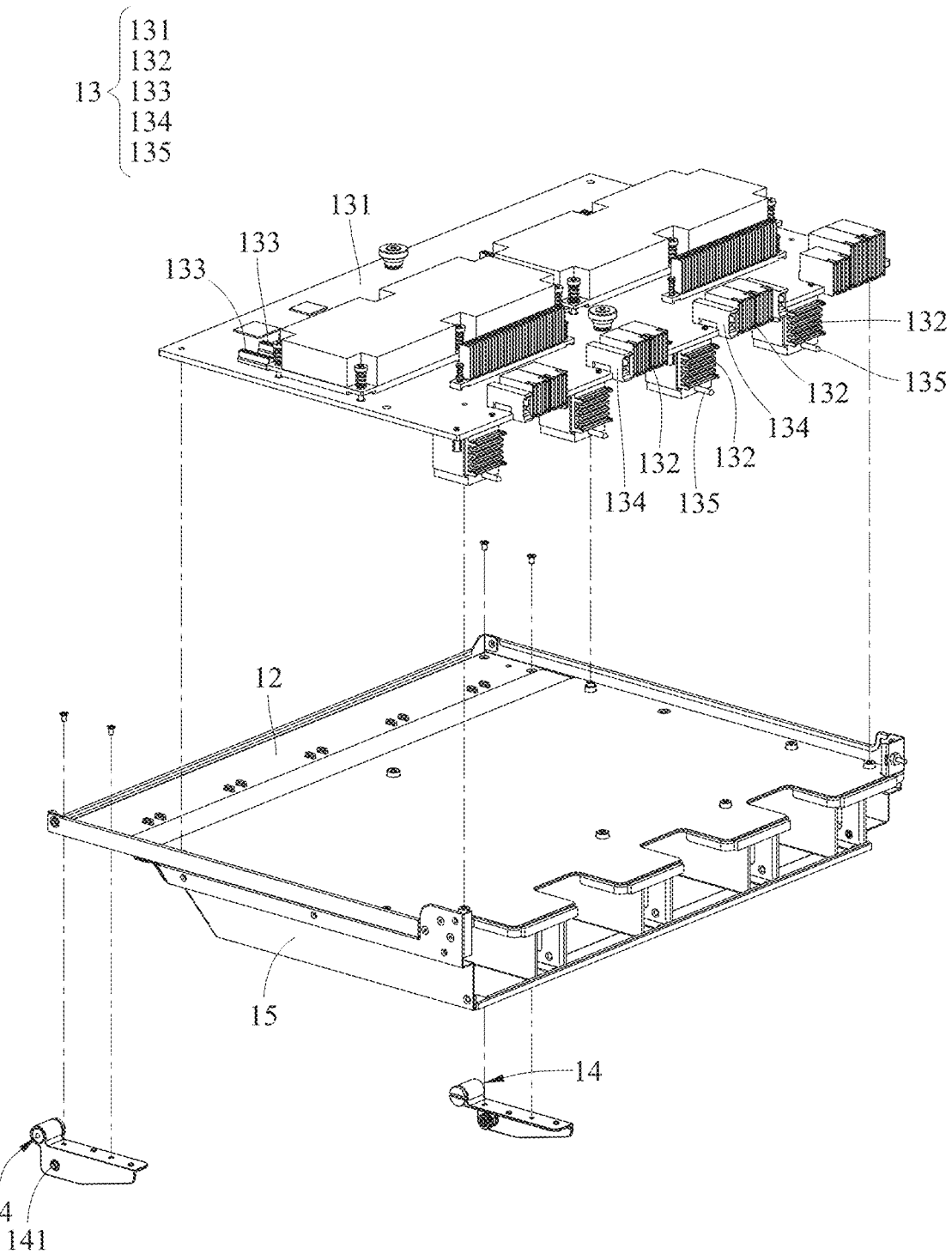
FIG. 4 is an exploded view of a movable tray and a riser module of the server device in FIG. 1.
Figure 5:
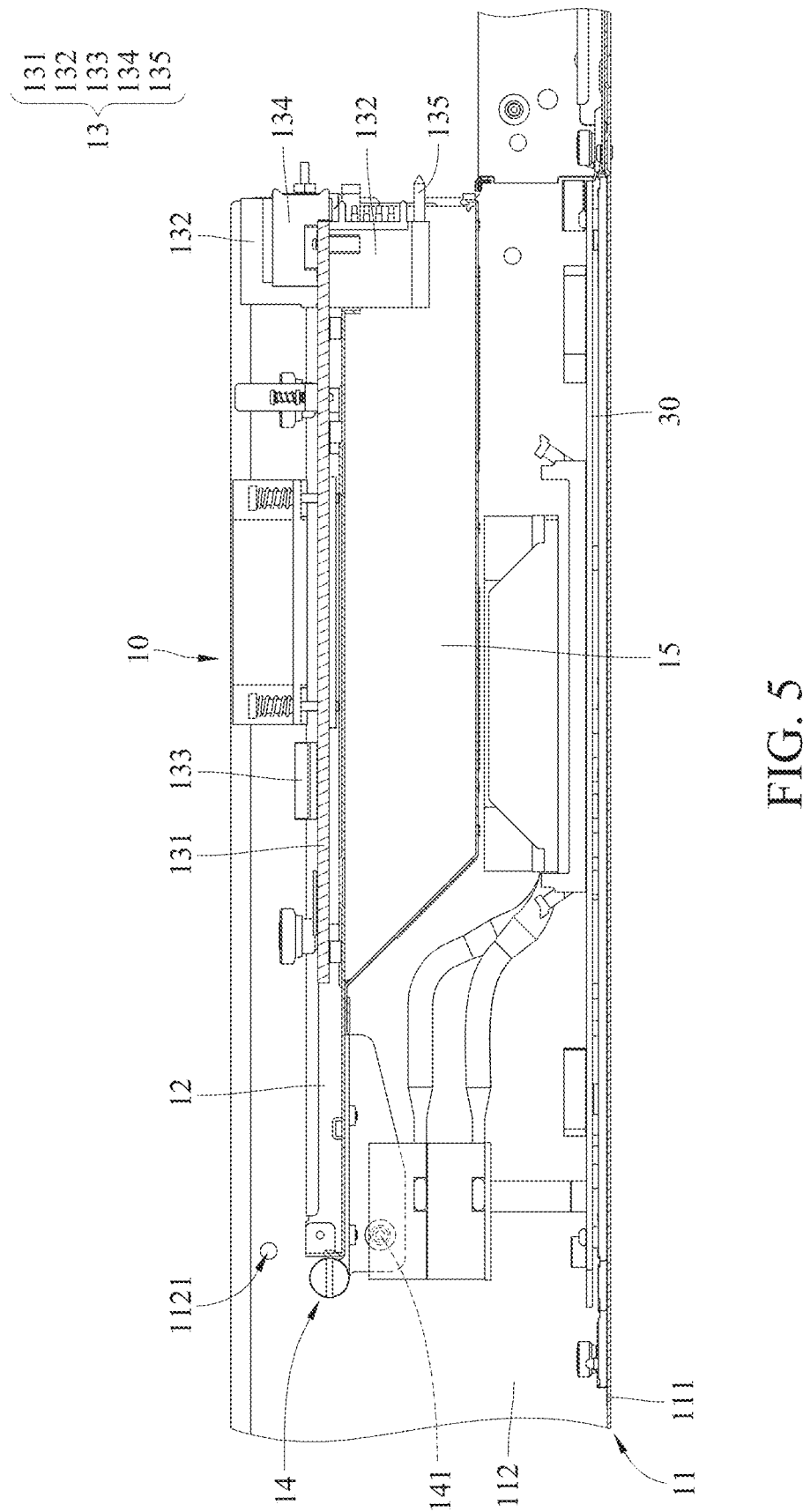
FIG. 5 is a cross-sectional view of the server device in FIG. 1.

Please refer to FIG. 1 to FIG. 5, where FIG. 3 is an exploded view of the server device 10 in FIG. 1, FIG. 4 is an exploded view of the movable tray 12 and the riser module 13 of the server device 10 in FIG. 1, and FIG. 5 is a cross-sectional view of the server device 10 in FIG. 1.

The two pivot members 14 are disposed on two opposite sides of the movable tray 12. The movable tray 12 is pivotally coupled to the two side plates 112 via the two pivot members 14, such that the movable tray 12 is rotatable relative to the chassis 11 to be located in an operating position or an overturned position. In addition, the movable tray 12 includes two first positioning structures 141. Each of the two side plates 112 includes a second positioning structure 1121. The two first positioning structures 141 are, for example, positioning protrusions, and the two second positioning structures 1121 are, for example, positioning holes. The two first positioning structures 141 are configured to be positioned with the two second positioning structures 1121. An angle between the movable tray 12 in the operating position and the movable tray 12 in the overturned position is, for example, 115 degrees, but the invention is not limited thereto.

The riser module 13 is disposed on the movable tray 12. That is, the riser module 13 and the motherboard 30 are located on an upper layer and a lower layer of the server device 10, respectively, and the riser module 13 and the movable tray 12 are movable relative to the chassis 11. The riser module 13 is configured to be electrically connected to the backplane 20 and the motherboard 30.

When the movable tray 12 is located in the operating position, the movable tray 12 lies flat, the riser module 13 is electrically connected to the backplane 20, and the two first positioning structures 141 are separated from the two second positioning structures 1211, respectively. When the movable tray 12 is located in the overturned position, the riser module 13 is separated from the backplane 20, and the two first positioning structures 141 are positioned with the two second positioning structures 1211, respectively, such that the movable tray 12 can be fixed in the overturned position.

In detail, the riser module 13 includes a riser board 131, a plurality of first electrical connectors 132 and a plurality of second electrical connectors 133. The first electrical connectors 132 are, for example, graphics card electrical connectors and network interface cards, respectively, and are disposed on the riser board 131. For example, the riser board 131 is a circuit board. The first electrical connectors 132 are, for example, high density ExaMax electrical connectors, and are configured for the expansion cards such as high performance network interface cards to be plugged into. Some parts of the first electrical connectors 132 are disposed on a side of the riser board 131 closest to the motherboard 30, and are, for example, board-to-board and electrically connected to the electrical connector of the riser card (not shown). Others of the first electrical connectors 132 are configured to be disposed on another side of the riser board 131 farthest away from the motherboard 30, and are, for example, board-to-board and electrically connected to GPUs (not shown) of the backplane 20. The second electrical connectors 133 are, for example, MCIO electrical connectors, and are disposed on the riser board 131. The second electrical connectors 133 are cable-to-cable and electrically connected to CPUs (not shown) of the motherboard 30 from a side of the movable tray 12 farthest away from the backplane 20 via cables (not shown). Accordingly, a cable management can be facilitated. The first electrical connectors 132 are electrically connected to the second electrical connectors 133, such that the backplane 20 is electrically connected to the motherboard 30 via the first electrical connectors 132 and the second electrical connectors 133.

The flow guide support frame 15 is disposed on a side of the movable tray 12 farthest away from the riser module 13. The flow guide support frame 15 is movable along with the movable tray 12 relative to the chassis 11. The flow guide support frame 15 can support the movable tray 12. In addition, the flow guide support frame 15 can also guide an airflow blown by a cooling device (not shown) such as a fan of the server device 10, so that the motherboard 30 can be cooled by the airflow more uniformly, thereby improving a cooling efficiency of the cooling device to the motherboard 30. That is, the flow guide support frame 15 can support the movable tray 12 while guiding the airflow for cooling the motherboard 30 to improve the cooling efficiency of the cooling device to the motherboard 30.

In this embodiment, the server device 10 includes the movable tray 12 rotatable relative to the chassis 11, with the riser module 13 disposed on the movable tray 12. Therefore, when the motherboard 30 disposed on the bottom plate 111 located on the lower layer is required to be mounted or replaced and is required for the cables to be plugged into, the movable tray 12 only need to be rotated without the need to remove the motherboard 30 and the riser module 13 from the upper layer, allowing the motherboard 30 disposed on the bottom plate 111 located on the lower layer to be easily accessed. Accordingly, the convenience of assembling and disassembling the motherboard 30 and the riser module 13 and the cable management can be improved.

In this embodiment, the riser module 13 may further include a plurality of first guiding structures 134 and a plurality of second guiding structures 135. The first guiding structures 134 are, for example, guiding recesses, and disposed on the riser board 131. The second guiding structures 135 are, for example, guiding protrusions, and disposed on the first electrical connectors 132. When the movable tray 12 is located in the operating position, the riser module 13 is configured to be fixed to the backplane 20 via a guidance of the first guiding structures 134 and the second guiding structures 135.

In this embodiment, the server device 10 further includes a plurality of fasteners 16. The fasteners 16 are, for example, screws. When the movable tray 12 is located in the operating position, the movable tray 12 is fixed to the two side plates 112 via the fasteners 16.

In this embodiment, the two first positioning structures 141 are positioning protrusions, and the two second positioning structures 1121 are positioning holes, but the invention is not limited thereto. In other embodiments, the two first positioning structures may be positioning holes, and the two second positioning structures may positioning protrusions.

In this embodiment, the riser module 13 includes multiple first electrical connectors 132 and multiple second electrical connectors 133, but the invention is not limited thereto. In other embodiments, the riser module may include only one first electrical connector and only one second electrical connector.

In this embodiment, the first guiding structures 134 are guiding recesses, and the second guiding structures 135 are guiding protrusions, but the invention is not limited thereto. In other embodiments, the first guiding structures may be guiding protrusions, and the second guiding structures may be guiding recesses.

In this embodiment, the flow guide support frame 15 may further include a plurality of third guiding structures (not shown). The third guiding structures are, for example, guiding recesses, but the invention is not limited thereto. In other embodiments, the third guiding structures may be guiding protrusions. When the movable tray 12 is located in the operating position, the flow guide support frame 15 is configured to force the riser module 13 further fixed to the backplane 20 via the third guiding structures.

Figure 6:
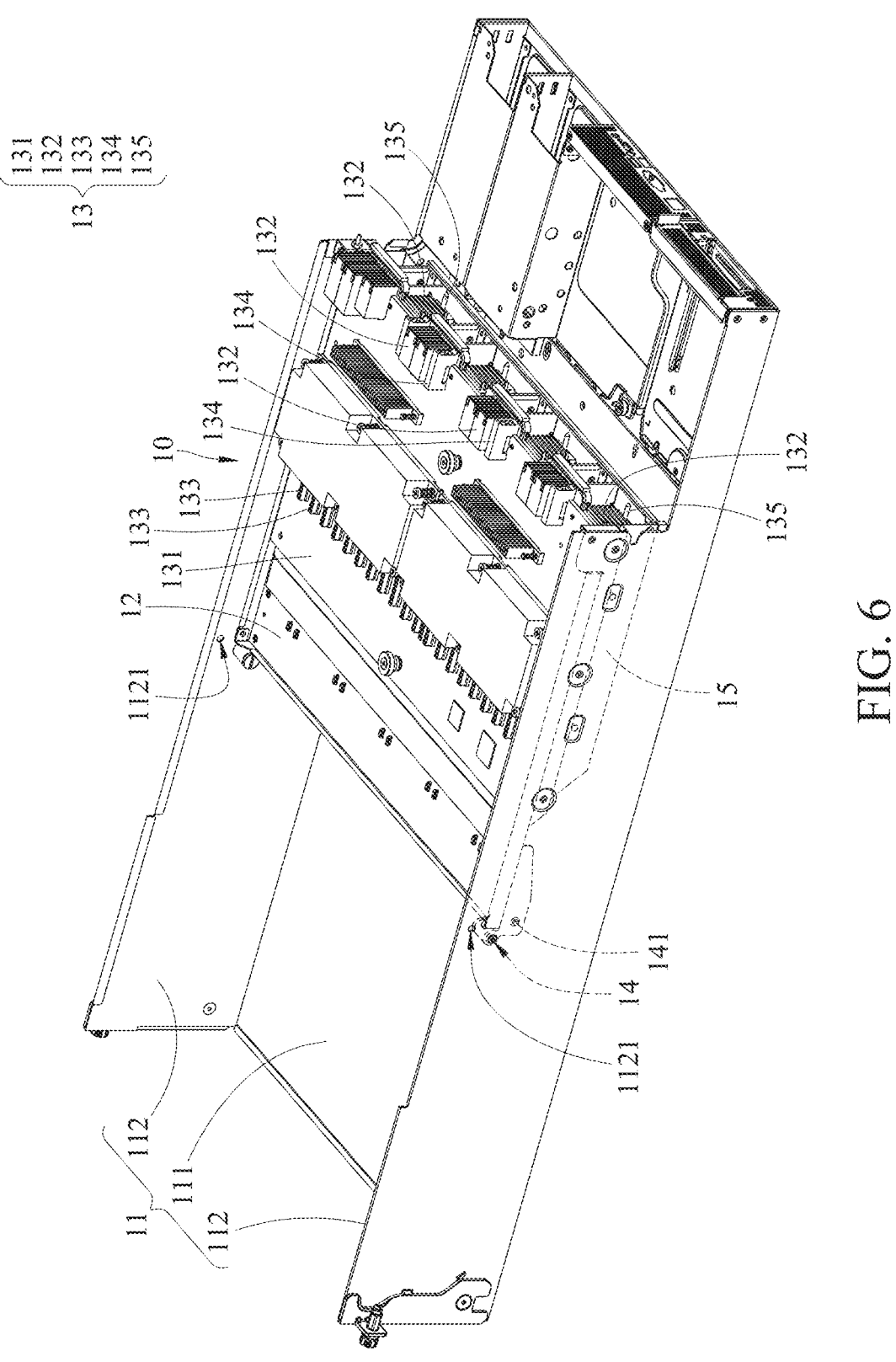
FIG. 6 is a perspective view of the movable tray of the server device in FIG. 1 located in an operating position.
Figure 7:
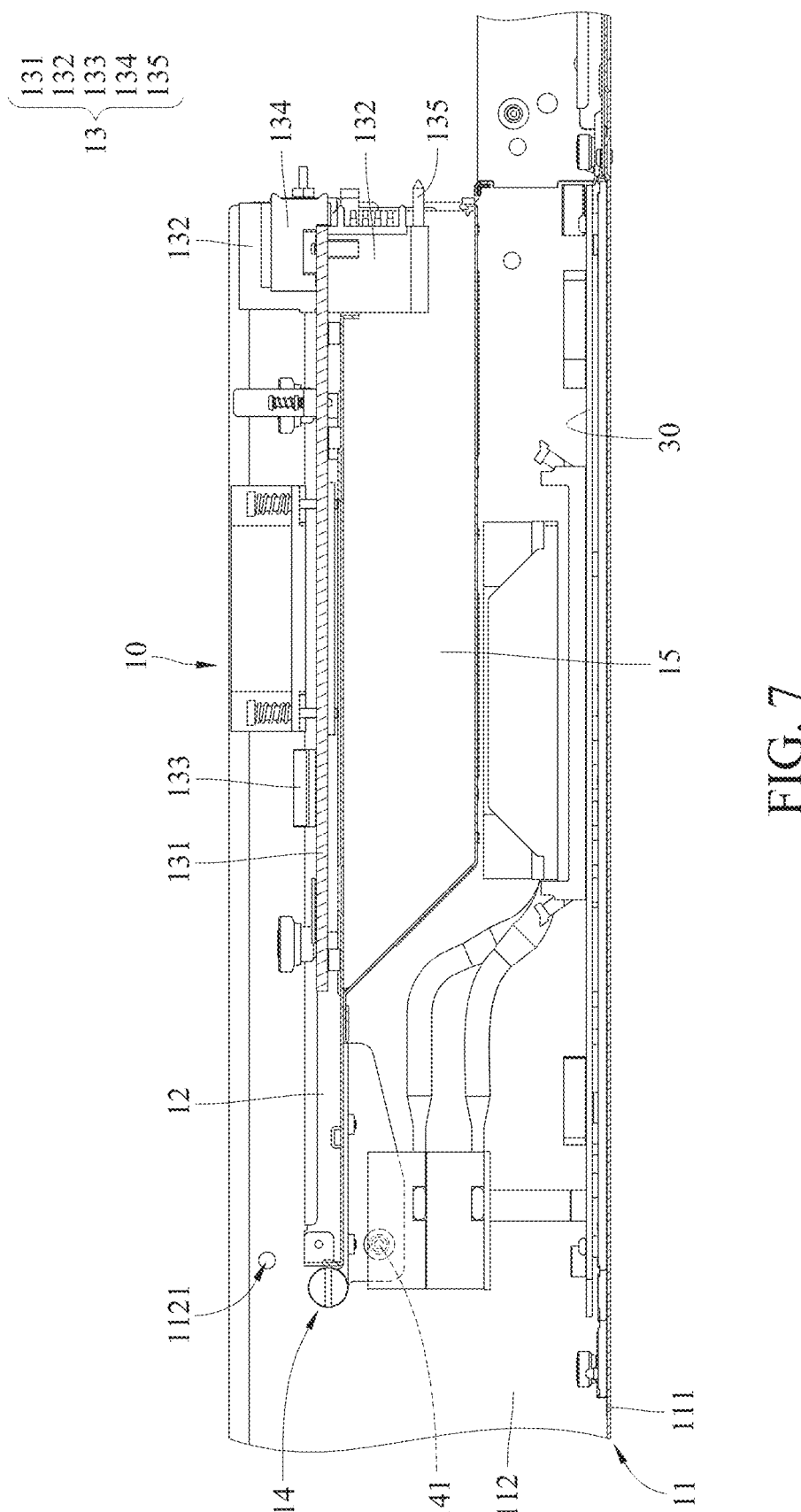
FIG. 7 is a cross-sectional view of the movable tray of the server device in FIG. 1 located in the operating position.
Figure 8:
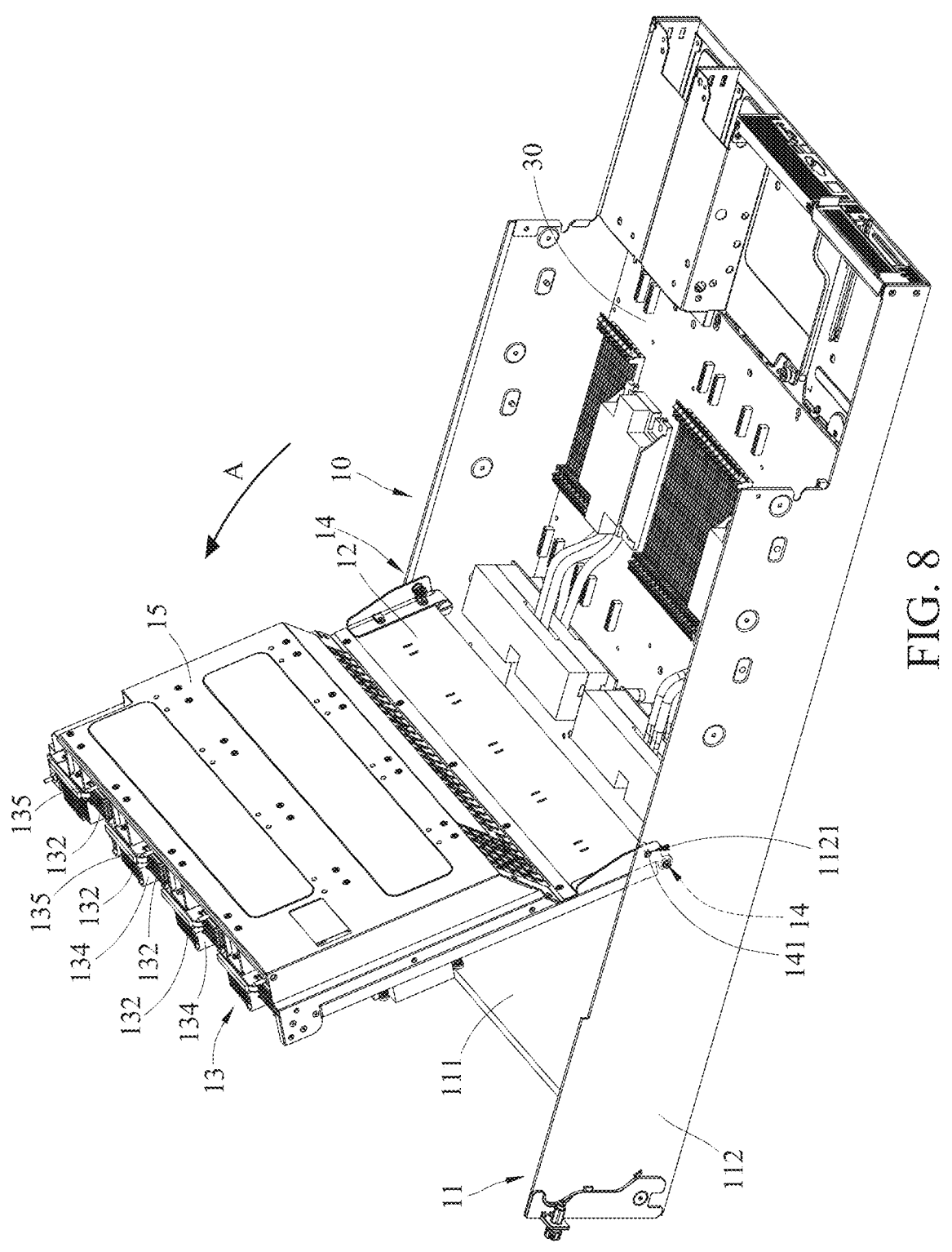
FIG. 8 is a perspective view of the movable tray of the server device in FIG. 1 located in an overturned position.
Figure 9:
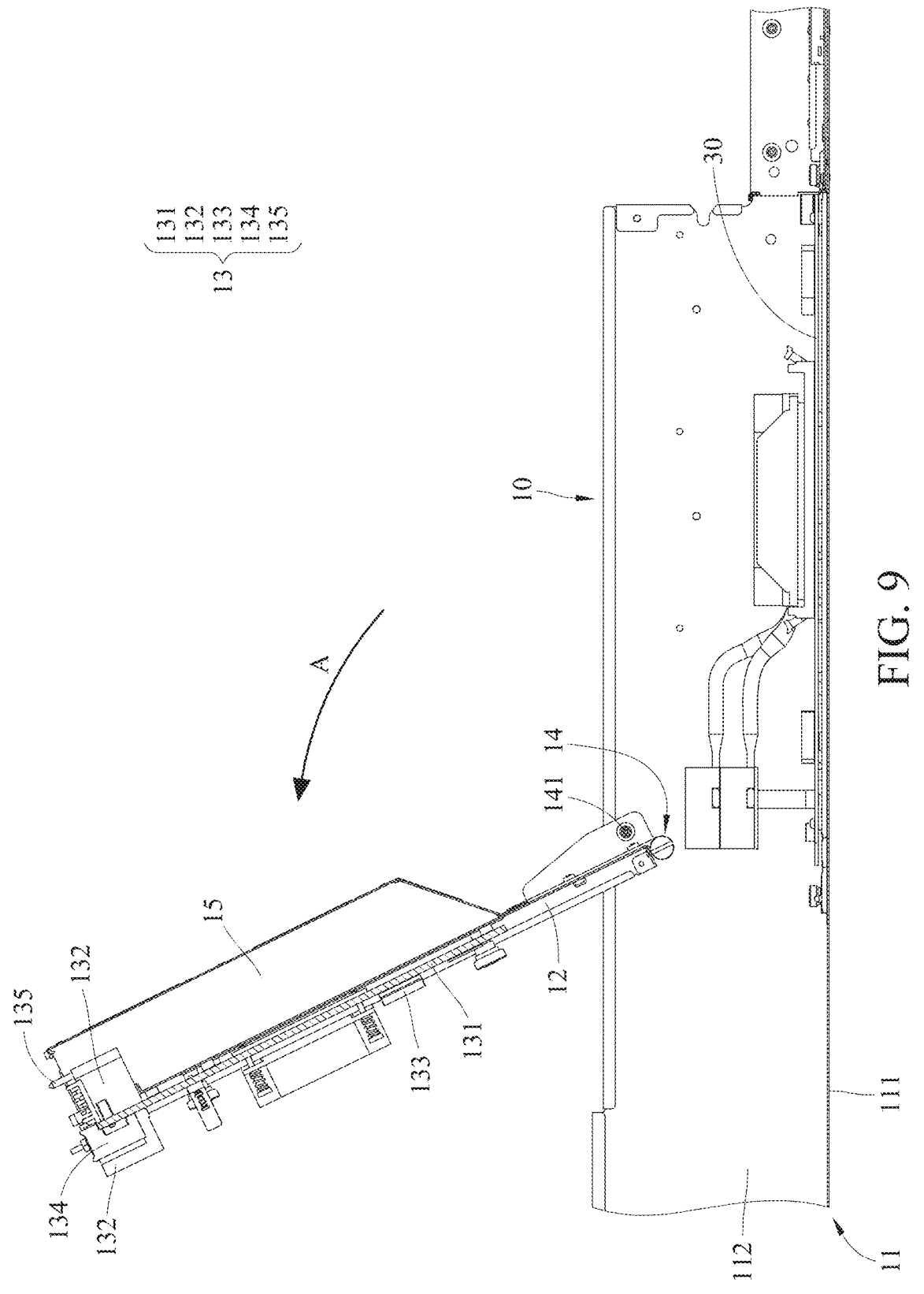
FIG. 9 is a cross-sectional view of the movable tray of the server device in FIG. 1 located in the overturned position.

Please refer to FIG. 1 to FIG. 9, where FIG. 6 is a perspective view of the movable tray 12 of the server device 10 in FIG. 1 located in the operating position, FIG. 7 is a cross-sectional view of the movable tray 12 of the server device 10 in FIG. 1 located in the operating position, FIG. 8 is a perspective view of the movable tray 12 of the server device 10 in FIG. 1 located in the overturned position, and FIG. 9 is a cross-sectional view of the movable tray 12 of the server device 10 in FIG. 1 located in the overturned position.

As shown in FIG. 6 and FIG. 7, the movable tray 12 lies flat in the operating position. At this time, the two first positioning structures 141 are separated from the two second positioning structures 1211, respectively. As shown in FIG. 8 and FIG. 9, when the motherboard 30 is required to be mounted in the chassis 11 and the riser module 13 is required to be electrically connected to the motherboard 30, firstly, rotate the movable tray 12 from the operating position to the overturned position along a direction A. At this time, the two first positioning structures 141 are positioned with the two second positioning structures 1211, respectively, fixing the movable tray 12 in the overturned position. Next, install the motherboard 30 and other electronic component such as a cooling device (e.g. a fan) onto the bottom plate 111. In addition, insert an end of each of cables (not shown) into the motherboard 30, and pass another end of each of the cables through the side of the movable tray 12 farthest away from the backplane 20.

Then, release a positioning between the two first positioning structures 141 and the two second positioning structures 1121, so the two first positioning structures 141 are separated from the two second positioning structures 1211, respectively, and rotate the movable tray 12 from the overturned position to the operating position along a direction opposite to the direction A. Then, electrically connect the riser module 13 to the backplane 20 through the first electrical connectors 132, and electrically connect the riser module 13 to the motherboard 30 through the second electrical connectors 133 and the cables. That is, the backplane 20 is electrically connected to the motherboard 30 via the riser module 13. Then, fix the movable tray 12 to the two side plates 112 via the fasteners 16. Accordingly, the motherboard 30 and the riser module 13 are installed in the chassis 11.

According to the server device disclosed by the above embodiment, the server device includes the movable tray rotatable relative to the chassis, with the riser module disposed on the movable tray. Therefore, when the motherboard disposed on the plate located on the lower layer is required to be mounted or replaced and is required for the cables to be plugged into, the movable tray only needs to be rotated without the need to remove the motherboard and the riser module from the upper layer, allowing the motherboard disposed on the plate located on the lower layer to be easily accessed. Accordingly, the convenience of assembling and disassembling the motherboard and the riser module and the cable management can be improved.

It will be apparent to those skilled in the art that various modifications and variations can be made to the invention.

It is intended that the specification and examples be considered as exemplary embodiments only, with the scope of the invention being indicated by the following claims.

What is claimed is:

1. A server device, configured for a backplane and a motherboard to be disposed thereon and comprising:
   a chassis, comprising a bottom plate and two side plates, wherein the two side plates are connected to two opposite sides of the bottom plate, respectively, and the bottom plate is configured for the motherboard to be disposed thereon;
   a movable tray;
   a riser module, disposed on the movable tray, wherein the riser module and the movable tray are movable relative to the chassis, and the riser module is configured to be electrically connected to the backplane and the motherboard;
   two pivot members, wherein the two pivot members are disposed on two opposite sides of the movable tray, the movable tray is pivotally coupled to the two side plates via the two pivot members, the movable tray is rotatable relative to the chassis to be located in an operating position or an overturned position; when the movable tray is located in the operating position, the riser module is configured to be electrically connected to the backplane; when the movable tray is located in the overturned position, the riser module is configured to be separated from the backplane; and
   a flow guide support frame, wherein the flow guide support frame is disposed on a side of the movable tray farthest away from the riser module, the flow guide support frame is movable along with the movable tray relative to the chassis, and the flow guide support frame is configured to support the movable tray while guiding an airflow for cooling the motherboard to improve a cooling efficiency to the motherboard.

2. The server device according to claim 1, wherein the riser module comprises a riser board and at least one first electrical connector, the at least one first electrical connector is disposed on the riser board, and the at least one first electrical connector is configured to be electrically connected to the backplane or an electrical connector of a riser card.

3. The server device according to claim 2, wherein the riser module further comprises at least one second electrical connector, the at least one second electrical connector is disposed on the riser board, the at least one second electrical connector is configured to be electrically connected to the motherboard via at least one cable, the at least one first electrical connector is electrically connected to the at least one second electrical connector, and the at least one first electrical connector and the at least one second electrical connector are configured for the backplane to be electrically connected to the motherboard.

4. The server device according to claim 2, wherein the at least one first electrical connector comprises a plurality of first electrical connectors, the plurality of first electrical connectors are graphics card electrical connectors and network interface cards, respectively, a part of the plurality of first electrical connectors is configured to be disposed on a side of the riser board closest to the motherboard and to be electrically connected to the electrical connector of the riser card, and another part of the plurality of first electrical connectors is configured to be disposed on a side of the riser board farthest away from the motherboard and to be electrically connected to the backplane.

5. The server device according to claim 2, wherein the riser module further comprises at least one first guiding structure and at least one second guiding structure, the at least one first guiding structure is disposed on the riser board, the at least one second guiding structure is disposed on the at least one first electrical connector, when the movable tray is located in the operating position, the riser module is configured to be fixed to the backplane via a guidance of the at least one first guiding structure and the at least one second guiding structure.

6. The server device according to claim 1, wherein the movable tray comprises at least one first positioning structure, at least one of the two side plates comprises a second positioning structure, the at least one first positioning structure is configured to be positioned with the second positioning structure; when the movable tray rotates from the operating position to the overturned position, the movable tray is fixed in the overturned position via a positioning of the at least one first positioning structure with the second positioning structure.

7. The server device according to claim 1, further comprising at least one fastener, wherein when the movable tray is located in the operating position, the movable tray is fixed to the two side plates via the at least one fastener.

8. The server device according to claim 1, wherein an angle between the movable tray located in the operating position and the movable tray in the overturned position is 115 degrees.

\* \* \* \* \*